(12) United States Patent
Shieh et al.

(10) Patent No.: US 9,947,704 B1
(45) Date of Patent: Apr. 17, 2018

(54) METHOD OF RECOVERY OF MOTFT BACKPLANE AFTER A-SI PHOTODIODE FABRICATION

(71) Applicants: Chan-Long Shieh, Paradise Valley, AZ (US); Gang Yu, Santa Barbara, CA (US); Guangming Wang, Santa Barbara, CA (US)

(72) Inventors: Chan-Long Shieh, Paradise Valley, AZ (US); Gang Yu, Santa Barbara, CA (US); Guangming Wang, Santa Barbara, CA (US)

(73) Assignee: CBRITE INC., Goleta, CA (US)

( * ) Notice: Subject to any disclaimer, the term of this patent is extended or adjusted under 35 U.S.C. 154(b) by 3 days.

(21) Appl. No.: 15/296,586

(22) Filed: Oct. 18, 2016

(51) Int. Cl.
*H01L 27/146* (2006.01)

(52) U.S. Cl.
CPC .... *H01L 27/14616* (2013.01); *H01L 27/1463* (2013.01); *H01L 27/1469* (2013.01); *H01L 27/14643* (2013.01); *H01L 27/14689* (2013.01); *H01L 27/14692* (2013.01)

(58) Field of Classification Search
USPC .......................................................... 257/43
See application file for complete search history.

(56) References Cited

U.S. PATENT DOCUMENTS

2011/0163310 A1* 7/2011 Park ................. H01L 29/78606
257/43
2013/0292573 A1* 11/2013 Antonuk ............. H01L 27/1462
250/361 R

* cited by examiner

*Primary Examiner* — Moazzam Hossain
*Assistant Examiner* — Warren H Kilpatrick
(74) *Attorney, Agent, or Firm* — Parsons & Goltry; Robert A. Parsons; Michael W. Goltry

(57) ABSTRACT

A method of fabricating a structure including a high mobility backplane and a-Si photodiode imager includes forming a matrix of metal oxide thin film transistors on the surface of a rigid support member, depositing a planarizing layer on the matrix of transistors that is either porous or permissive/diffusive to oxygen at temperatures below approximately 200° C., and fabricating a matrix of passivated a-Si photodiodes over the matrix of transistors and electrically connected one each photodiode to each of the transistors. A continuous path is provided through the planarizing layer from the exterior of the structure to each of the transistors and the structure is annealed at a temperature below 200° C. in an oxygen ambient to move oxygen from the oxygen ambient to an active layer of each of the transistors and repair loss of oxygen damage to the transistors caused by the fabrication of the passivated a-Si photodiodes.

14 Claims, 2 Drawing Sheets

BCE WITH TFT EXPOSED

METHOD OF RECOVERY OF MOTFT BACKPLANE AFTER A-SI PHOTODIODE FABRICATION

FIELD OF THE INVENTION

This invention generally relates to the fabrication of an a-Si photodiode array on a MOTFT backplane and a method of recovering/restoring mobility to the MOTFTs.

BACKGROUND OF THE INVENTION

There is a strong incentive to provide a high mobility backplane for X-ray imagers based on a-Si photodiodes (PD). The major problem is to achieve a high pixel count, real time image above 10 frames per second, since the existing a-Si TFT backplane suffers from low mobility (<1 $cm^2/Vs$) and limited time to transfer charges from the image pixel to a peripheral readout chip. In this prior art system, 4 or more pixels must be "binned" together to comprise a faster frame time. The switch resistance of each individual switch is on the order of mega-ohms. Poly-Si TFT technology van fit the gap in mobility, but poly-Si TFTs suffer from high leakage current and non-uniformity in the leakage current and in TFT threshold voltage. Single crystalline Si imagers have been fabricated and stitched together to satisfy high end applications, but the cost of crystalline Si imagers is prohibitive for general digital radiology in the medical field.

There has been a lot of progress in metal oxide thin film transistors (MOTFT) both in mobility and reliability. Mobility beyond 50 $cm^2/Vs$ has been demonstrated, for example, in U.S. Pat. No. 9,356,156, entitled "Stable High Mobility MOTFT and Fabrication at Low Temperature", issued May 31, 2016 and incorporated herein by reference. Also, because of the larger bandgap in the metal oxide material forming the channel of the TFT, leakage current lower than fA can be easily achieved. Further, in a preferred embodiment the metal oxide material in the channel is nanocrystalline or amorphous, whereby uniformity is insured because the number of grains in the device channel area is larger and associated fluctuations between devices in an array of devices caused by a small number of grains is avoided.

MOTFTs can provide an ideal high mobility backplane for a-Si photodiode imagers. The key challenge remains in the fabrication compatibility between a-Si PN or PIN photodiode technology and the MOTFT technology. Throughout this disclosure the term "photodiode" or "PD" is defined to include both pn diodes and PIN diodes. There are basically two ways to fabricate a MOTFT backplane/a-Si photodiode imager. One way is to fabricate an a-Si photodiode imager on a glass substrate first and then fabricate a MOTFT pixel readout circuit on the photodiode imager, as disclosed, for example, in U.S. Pat. No. 8,962,377, entitled "Pixelated Imager with MOTFT and Process", issued Feb. 24, 2015, and incorporated herein by reference. The advantage in such an approach is that the MOTFTs will not have to survive the PECVD process used in the formation of a-Si photodiodes and in the SiN passivation (since the a-Si photodiodes are formed first). On the other hand, the a-Si photodiodes have to survive the MOTFT fabrication process. The a-Si photodiodes can survive below 250° C. well, therefore the MOTFT process is constrained to below 250° C. Also, the thickness of the a-Si photodiodes and the thickness of the PECVD passivation layer are very thick and it is important to have a low thermal budget below 250° C. for the MOTFT process to prevent cracking of the a-Si photodiodes during the thermal processing of the MOTFTs.

The other approach is to fabricate the MOTFT backplane first and then integrate the a-Si photodiode imager over the MOTFT backplane. In this approach, the MOTFT fabrication is no longer constrained to below 250° C. More process options can be adopted. However, the key challenge to this approach is that the MOTFTs have to survive the fabrication process for the a-Si photodiode array and its passivation. In the a-Si photodiode fabrication process, the deposition of the a-Si photodiodes and the SiN passivation film are typically performed at elevated temperatures (around 200° C. to 250° C.). There is a large amount of hydrogen in the ambient during the deposition of both the a-Si and the SiN. The hydrogen in the ambient at high temperature (200° C. to 250° C.) can destroy the MOTFT performance. The effect is even more severe for high performance MOTFT (e.g. with mobility >20 $cm^2/Vs$).

One way to prevent the destruction of the MOTFTs is to create a good hydrogen barrier as described, for example, in co-pending U.S. patent application Ser. No. 15/188,762, entitled "Insulator/Metal Passivation of MOTFT", filed Jun. 21, 2016, and incorporated herein by reference.

It would be highly advantageous, therefore, to remedy the foregoing and other deficiencies inherent in the prior art and/or to improve the fabrication process.

Accordingly, it is an object of the present invention to provide a new and improved process for the recovery of MOTFTs in a MOTFT backplane after the fabrication of an a-Si photodiode imager and passivation film thereon.

It is another object of the present invention to provide a new and improved process for fabricating an a-Si photodiode imager on a MOTFT backplane.

It is another object of the present invention to provide a new and improved structure including a MOTFT backplane and a-Si photodiode imager wherein the MOTFTs in a MOTFT backplane are recovered after the fabrication of an a-Si photodiode imager and passivation film on the backplane.

SUMMARY OF THE INVENTION

The desired objects of the instant invention are achieved in accordance with a method of fabricating a structure including a high mobility backplane and a-Si photodiode imager. The method including the steps of providing a rigid support member with a surface, forming at least one metal oxide thin film transistor on the surface of the rigid support member, depositing a planarizing layer on the metal oxide thin film transistor, and fabricating a passivated a-Si photodiode over the metal oxide thin film transistor electrically connected to the metal oxide thin film transistor. The planarizing layer is one of porous or permissive/diffusive to oxygen at temperatures below approximately 200° C. A step of providing a continuous path through the planarizing layer from the exterior to the metal oxide thin film transistor is performed and the structure is annealed at a temperature below approximately 200° C. in an oxygen ambient to move oxygen from the oxygen ambient to an active layer of the metal oxide thin film transistor and repair loss of oxygen damage to the metal oxide thin film transistor caused by the fabrication of the passivated a-Si photodiode.

The desired objects of the instant invention are also achieved in accordance with a specific method of fabricating a structure including a high mobility backplane and a-Si photodiode imager. The specific method includes the steps of providing a rigid support member with a surface, forming a matrix of metal oxide thin film transistors on the surface of the rigid support member, and depositing a planarizing layer on the matrix of metal oxide thin film transistors, the planarizing layer being one of porous or permissive/diffusive to oxygen at temperatures below approximately 200° C. The metal oxide thin film transistors including one of an etch-stop type of transistor and a back channel etch type of transistor. A matrix of passivated a-Si photodiodes is fabricated over the matrix of metal oxide thin film transistors, one passivated a-Si photodiode associated with each one of the metal oxide thin film transistors of the matrix of metal oxide thin film transistors and electrically connected to the associated metal oxide thin film transistor. The matrix of passivated a-Si photodiodes including blanket layers of a-Si to form one of a P-N or P-I-N photodiode, performing an isolation etch to separate the blanket layers into the photodiode matrix and passivating the isolated photodiodes with a blanket layer of SiN. A continuous path is provided through the planarizing layer from the exterior of the structure to each metal oxide thin film transistor of the matrix of metal oxide thin film transistors. The structure is annealed at a temperature below approximately 200° C. in an oxygen ambient to move oxygen from the oxygen ambient to an active layer of each metal oxide thin film transistor of the matrix of metal oxide thin film transistors and repair loss of oxygen damage to each metal oxide thin film transistor caused by the fabrication of the matrix of passivated a-Si photodiodes.

The desired objects of the instant invention are also achieved in accordance with a specific structure including a high mobility backplane and a-Si photodiode imager. The specific structure includes a rigid support member with a surface, a matrix of metal oxide thin film transistors formed on the surface of the rigid support member, and a planarizing layer deposited on the metal oxide thin film transistor. The planarizing layer is one of porous or permissive/diffusive to oxygen at temperatures below approximately 200° C. and the metal oxide thin film transistors of the matrix of metal oxide thin film transistors include one of an etch-stop type of transistor and a back channel etch type of transistor. A matrix of passivated a-Si photodiodes is formed over the matrix of metal oxide thin film transistors, one passivated a-Si photodiode of the matrix of passivated a-Si photodiodes associated with each one of the metal oxide thin film transistors of the matrix of metal oxide thin film transistors and electrically connected to the associated metal oxide thin film transistor. The matrix of passivated a-Si photodiodes includes blanket layers of a-Si forming one of P-N or P-I-N photodiodes. The photodiode matrix is covered with a blanket layer of SiN, and the a-Si photodiode and SiN blanket layers are isolated into separate photodiodes to form the passivated photodiode matrix. There is a continuous path through the planarizing layer from the exterior of the structure to each metal oxide thin film transistor of the matrix of metal oxide thin film transistors. Each metal oxide thin film transistor of the matrix of metal oxide thin film transistors is repaired for loss of oxygen damage to each metal oxide thin film transistor caused by fabrication of the matrix of passivated a-Si photodiodes.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1A:
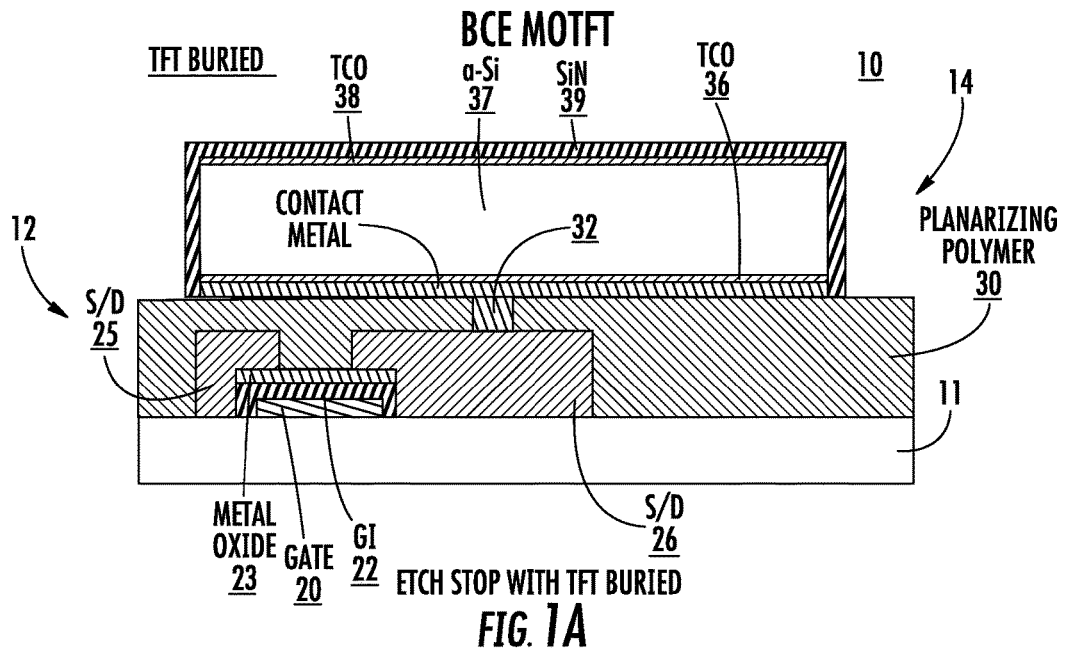
FIG. 1A is a simplified layer diagram illustrating an etch-stop type of MOTFT positioned between an a-Si photodiode and a supporting substrate, in accordance with the present invention.
Figure 1B:
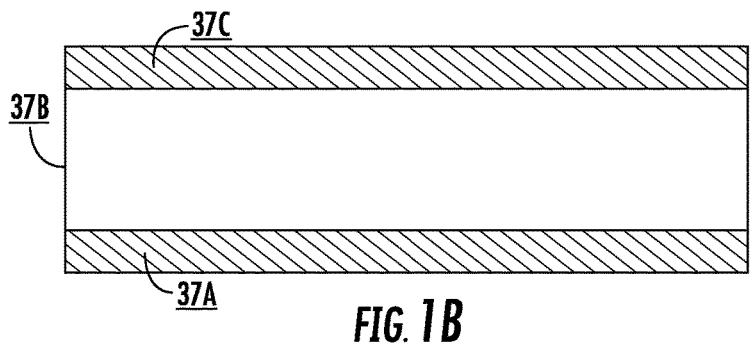
FIG. 1B illustrates additional information of a layer of the etch-stop type of MOTFT of FIG. 1.

Turning to FIGS. 1A and 1B, a simplified layer diagram of an imager pixel 10 is illustrated showing an etch-stop type of MOTFT 12 positioned between an a-Si photodiode 14 and a supporting substrate 11, in accordance with the present invention. It will be understood that pixel 10 is a single pixel in an array of pixels forming, for example, a large area (e.g. 1-40 cm square) X-ray imager or similar device. Generally, all of the MOTFTs (including MOTFT 12) formed on substrate 11 are referred to as a "backplane" and the photodiodes (including photodiode 14) are formed in an array or matrix on top of the backplane. MOTFT 12 includes a gate 20 positioned on substrate 11, a thin layer 22 of gate dielectric material, an active layer 23 of metal oxide semiconductor material, a patterned area of etch-stop material 25 positioned on and defining a channel area in active layer 23, and spaced apart source/drain contacts 26 in contact with active layer 23 on opposite sides of etch-stop material 25. Additional information as to some exemplary fabrication processes and materials for this type of TFT can be found in U.S. Pat. No. 7,977,151, entitled "Double Self-Aligned Metal Oxide TFT", issued Jul. 12, 2011, and incorporated herein by reference.

In this specific example, etch-stop material 25 consists of a photopatternable polymer material such as polyimide (e.g. Toray 4100), acrylic polymer (e.g. PC403 or PC452 produced by JSR Company, ZWD6216 from Zeon Corporation, polymethylglutarimide (PMGI) from MicroChem Corp) or other polymers which are porous or permissive/diffusive to oxygen at temperatures below approximately 200° C. A series of organic materials with such characteristics for the etch-stop layer in a MOTFT are disclosed in U.S. Pat. No. 8,679,905, entitled "Metal Oxide TFT with Improved Source/Drain Contacts", issued Mar. 25, 2014, and incorporated herein by reference.

A planarizing layer 30 is deposited over MOTFT 12 to isolate MOTFT 12 from photodiode 14. In this specific example, planarizing layer 30 consists of the same or similar polymer material as etch-stop material 25 (i.e. oxygen diffusivity is high at low temperatures, <200° C.). A via 32 is opened through planarizing layer 30 to provide interconnection between MOTFT 12 and photodiode 14. The planarized backplane is now ready for the fabrication of a matrix of photodiodes thereon.

In the preferred process for fabricating a matrix of photodiodes, a blanket layer 34 of contact metal is deposited on the upper surface of planarizing layer 30. An optional second contact layer with transparent conducting metal oxide layer 36 is sometimes coated over metal layer 34. Layer 37 denotes the amorphous silicon photosensing layer. FIG. 1B illustrates a preferred configuration used for layer 37. Sensing layer 37 comprises a blanket layer 37A of p or n doped a-Si deposited on blanket layer 36 (and or 34) of contact metal. A blanket layer 37B of undoped (intrinsic or insulating) a-Si is deposited on blanket layer 37A of p or n doped a-Si. A blanket layer 37C of n or p doped a-Si is deposited on blanket layer 37B of undoped a-Si. A blanket transparent conducting metal-oxide 38 is deposited on 37C as the top contact electrode. The blanket layers of p or n doped a-Si, undoped a-Si, n or p doped a-Si, and contact metal are then etched to isolate the photodiodes into the desired matrix and associate one each photodiode 13 with each one MOTFT 14 in the backplane. After isolation etching photodiode 14 includes layers 34 and 36 of bottom contact electrode, layer 37A of n or p type a-Si, layer 37B of undoped a-Si, layer 37C of p or n type a-Si, and layer 38 of top transparent electrode. While the preferred P-I-N type photodiode is illustrated it will be understood that in some applications a simple P-N diode may be sufficient.

Isolated photodiode 14 is then passivated with a layer 39 of SiN covering all exposed areas down to planarizing layer 30. Any SiN that may be deposited or otherwise formed between adjacent photodiodes is removed to expose portions or surfaces 40 of planarizing layer 30 around passivated photodiode 14. The step of removing the SiN between adjacent photodiodes might include, for example, the steps of depositing a photopatternable layer, patterning openings in the layer between adjacent photodiodes, etching the SiN exposed by the patterning, and then removing the remaining photopatternable layer. As explained above, there is a high hydrogen ambient during deposition of both the a-Si and the SiN at high temperature (200° C. to 250° C.). This hydrogen ambient will remove oxygen from metal oxide active layer 23 of MOTFT 12 resulting in damage to the operation of MOTFT 12.

In the present invention, planarizing layer 30 is sufficient to reduce or minimize the damage done to MOTFT 12 during fabrication of passivated photodiode 14, or deposition of the a-Si and SiN. The exposed portions 40 of passivating layer 30 provide a continuous network of material with high oxygen diffusivity at low temperatures, <200° C.). By annealing the pixel 10 (i.e. the backplane and photodiode matrix) in an oxidizing ambience, the high diffusivity of planarizing layer 30 enables the repair of damage to MOTFT 12 even at low temperature (<200° C.). This repair function even works for a MOTFT (e.g. MOTFT 12) buried underneath an a-Si photodiode (e.g. photodiode 14). As long as there is an opening in the SiN passivation layer 39, within each pixel, for example, the size of 100 microns and the network of passivating material (e.g. polymer) is continuous from the top surface of the MOTFT to the opening in the SiN, the MOTFT can be annealed back to normal operation with the proper choice of planarizing material (e.g. organic polymer).

After recovering of the MOTFT performance by annealing in oxygen contained environment, another dielectric coating can be coated over the passivation layer 39 and the opening area (exposed portions 40) between each neighbor sensing elements. Photopatternable organic materials similar to that used for layer 25, 30 can be used for such purpose. Inorganic dielectric from precursor polymers can also be used for such purpose. Another patterned metal layer (not shown in FIG. 1) can then be deposited, patterned and connected through a via through layer 39 to the top electrode 38 to serve as the common electrode. One can also use the same metal layer for the data lines of the image array to minimize peripheral capacitance couplings and reduce the related readout noises.

Figure 2:
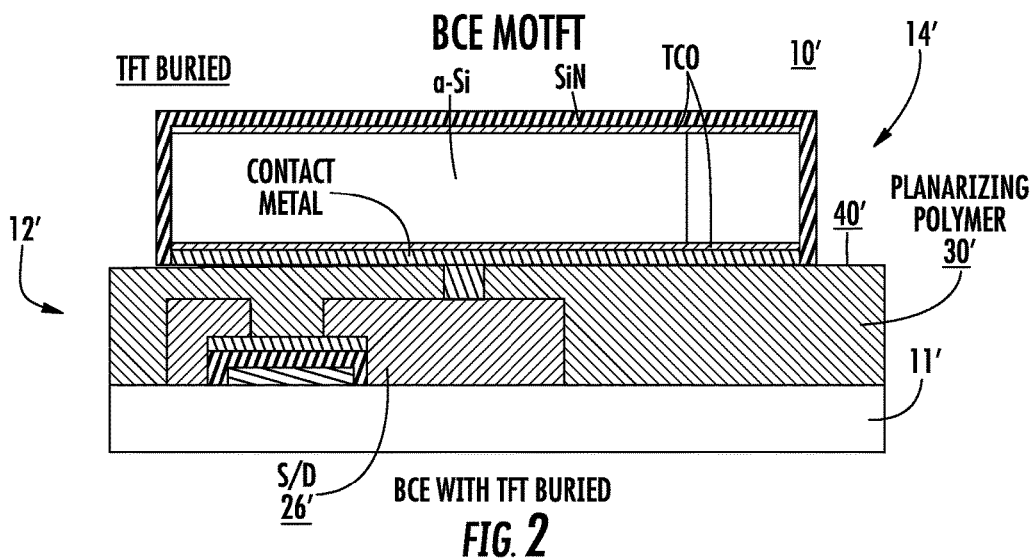
FIG. 2 is a simplified layer diagram illustrating a BCE type of MOTFT positioned between an a-Si photodiode and a supporting substrate, in accordance with the present invention.

Turning to FIG. 2, a simplified layer diagram of an imager pixel 10' is illustrated showing a back-channel-etch (BCE) type of MOTFT 12' positioned between an a-Si photodiode 14' and a supporting substrate 11', in accordance with the present invention. All components in FIG. 2 that are similar to components in FIG. 1 are designated with a similar number and a prime (') is added to denote a different embodiment. In a similar fashion, the same procedure as described above can be used for BCE type MOTFT 12'. The only difference between MOTFT 12 and MOTFT 12' is that etch-stop material 25 is not present in MOTFT 12'. Therefore, planarizing layer 30' extends into and fills the opening between source/drain contacts 26'. Thus, when openings to planarization layer 30' are formed at 40' a continuous network of passivating material is provided from the metal oxide active layer of MOTFT 12' to the opening 40' and MOTFT 10' can be annealed back to normal operation after fabrication of a-Si photodiode 14'.

The buried configuration of etch-stop MOTFT 10 in FIG. 1 or BCE MOTFT in FIG. 2 enables a large fill factor because the backplane MOTFT is buried underneath the a-Si photodiode matrix. The fill factor is mostly determined by the photodiode alone without having to worry about the constraint from the backplane. This configuration is even more advantageous for the fabrication of a high density imager with very small pitch (<20 microns), for example, in applications in bio-sensing. Furthermore, in the fabrication of active pixel sensor (APS) backplanes where more than one transistor is incorporated in each pixel, the burial of the transistors underneath the photodiodes is necessary to achieve a descent or even useable fill factor.

Figure 3:
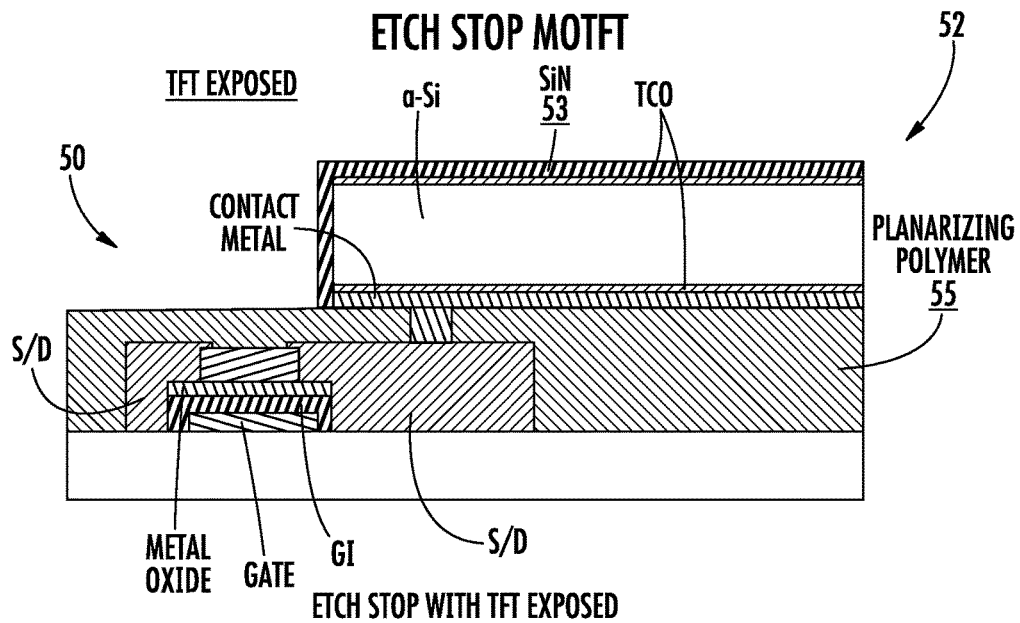
FIG. 3 is a simplified layer diagram illustrating an etch-stop type of MOTFT backplane positioned between an a-Si photodiode array and a supporting substrate with the MOTFT partially exposed adjacent the associated a-Si photodiode, in accordance with the present invention.

Turning to FIG. 3, it will be understood that in some applications in order to reduce the demand on the oxygen diffusivity of a polymer planarizing layer 55, a MOTFT 50 can be exposed directly. In this pixel configuration, an a-Si photodiode 52 is fabricated to one side of MOTFT 50 so that after deposition of a SiN layer 53 any SiN deposited above MOTFT 50 can be etched away to expose the upper surface of polymer planarizing layer 55. In some cases, the SiN may not be deposited on planarization layer 55 and, therefore, the upper surface is exposed. Thus, in either case a direct path is open through planarization layer 55 to the active layer of metal oxide in MOTFT 50 and oxygen can be diffused through a much shorter path. This configuration broadens the selection of planarization polymer 55 to include some organic/inorganic mixture or a pure inorganic film.

Figure 4:
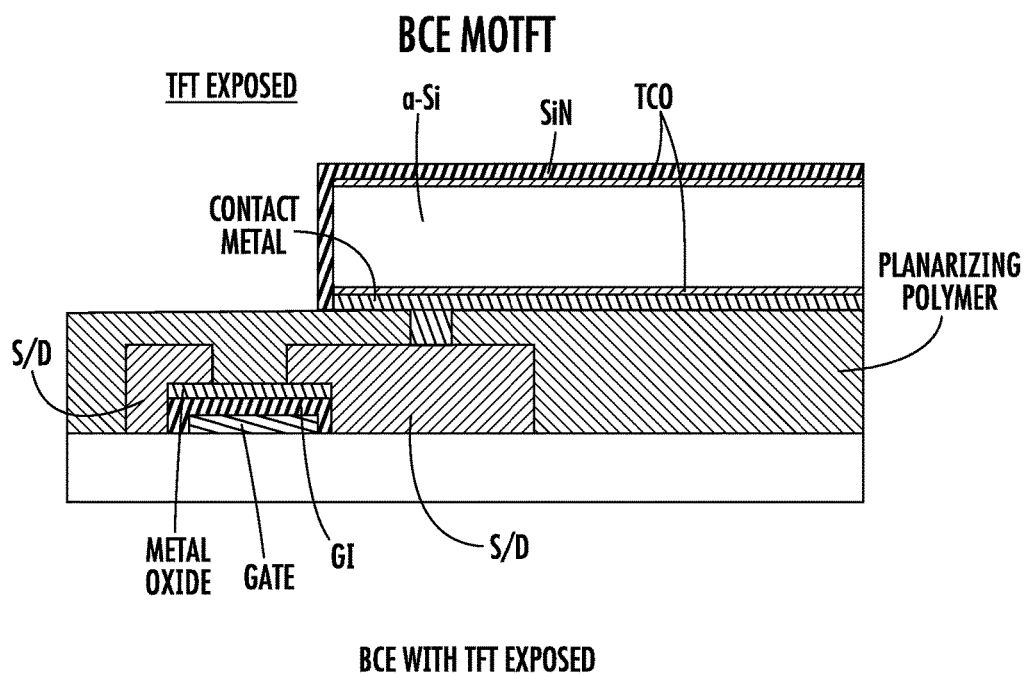
FIG. 4 is a simplified layer diagram illustrating a BCE type of MOTFT backplane positioned between an a-Si photodiode array and a supporting substrate with the MOTFT partially exposed adjacent the associated a-Si photodiode, in accordance with the present invention.

In a similar configuration, a BCE MOTFT can be fabricated to one side of an a-Si photodiode to expose the upper surface of a polymer planarization layer, as illustrated in FIG. 4.

Thus, the present invention provides new and improved processes for the recovery of MOTFTs in a MOTFT backplane after the fabrication of an a-Si photodiode imager and passivation film thereon. The present invention further provides a new and improved process for fabricating an X-ray image detector incorporating a MOTFT backplane and a-Si photodiode imager.

The TFT drawing in FIGS. 1-4 can be generalized as a pixel readout circuit comprising more than one TFT. For example, an active pixel sensing (APS) circuit can be constructed with three transistors plus a storage capacitor.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of fabricating a structure including a high mobility backplane and a-Si photodiode imager comprising the steps of:
   providing a rigid support member with a surface;
   forming a metal oxide thin film transistor on the surface of the rigid support member;
   depositing a planarizing layer on the metal oxide thin film transistor, the planarizing layer being one of porous or permissive/diffusive to oxygen at temperatures below approximately 200° C.;
   fabricating a passivated a-Si photodiode over the metal oxide thin film transistor electrically connected to the metal oxide thin film transistor;
   providing a continuous path through the planarizing layer from the exterior of the structure to the metal oxide thin film transistor; and
   annealing the structure at a temperature below approximately 200° C. in an oxygen ambient to move oxygen from the oxygen ambient to an active layer of the metal oxide thin film transistor and repair loss of oxygen damage to the metal oxide thin film transistor caused by the fabrication of the passivated a-Si photodiode.

2. A method as claimed in claim 1 wherein the step of forming the metal oxide thin film transistor includes forming one of an etch-stop type of transistor and a back channel etch type of transistor.

3. A method as claimed in claim 1 wherein the step of fabricating the passivated a-Si photodiode over the metal oxide thin film transistor includes fabricating the passivated a-Si photodiode one of directly over the metal oxide thin film transistor and to one side of the metal oxide thin film transistor.

4. A method as claimed in claim 1 wherein the step of depositing a planarizing layer includes depositing a polymer with high oxygen diffusivity at temperatures below approximately 200° C.

5. A method as claimed in claim 1 wherein the step of depositing a planarizing layer includes depositing a photo-patternable polymer material including one of a polyimide or an acrylic polymer.

6. A method as claimed in claim 1 wherein the step of forming the metal oxide thin film transistor includes forming a matrix of metal oxide thin film transistors.

7. A method as claimed in claim 6 wherein the step of fabricating the passivated a-Si photodiode includes fabricating a matrix of passivated a-Si photodiodes over the matrix of metal oxide thin film transistors, one passivated a-Si photodiode of the matrix of passivated a-Si photodiodes associated with each one of the metal oxide thin film transistors of the matrix of metal oxide thin film transistors and electrically connected to the associated metal oxide thin film transistor.

8. A method as claimed in claim 7 wherein the step of fabricating the matrix of passivated a-Si photodiodes includes depositing blanket layers of a-Si to form one of a P-n or P-i-n photodiode, performing an isolation etch to separate the blanket layers into the photodiode matrix and passivating the photodiode matrix with a blanket layer of SiN.

9. A method as claimed in claim 8 wherein the step of providing a continuous path includes removing any SiN between adjacent photodiodes to expose portions or surfaces of the planarizing layer around the passivated photodiode.

10. A method as claimed in claim 9 wherein the step of removing any SiN between adjacent photodiodes includes etching the SiN.

11. A method as claimed in claim 1 wherein the step of forming the metal oxide thin film transistor includes forming an etch-stop type of transistor and the step of depositing the planarizing layer includes depositing the same material used in the etch-stop of the etch-stop type of transistor.

12. A method as claimed in claim 1 wherein the step of fabricating the passivated a-Si photodiode electrically connected to the metal oxide thin film transistor includes forming a via through the planarizing layer and in communication with the underlying metal oxide thin film transistor and depositing a layer of contact metal over the planarizing layer and through the via.

13. A method of fabricating a structure including a high mobility backplane and a-Si photodiode imager comprising the steps of:
   providing a rigid support member with a surface;
   forming a matrix of metal oxide thin film transistors on the surface of the rigid support member, the metal oxide thin film transistors including one of an etch-stop type of transistor and a back channel etch type of transistor;
   depositing a planarizing layer on the matrix of metal oxide thin film transistors, the planarizing layer being one of porous or permissive/diffusive to oxygen at temperatures below approximately 200° C.;
   fabricating a matrix of passivated a-Si photodiodes over the matrix of metal oxide thin film transistors, one passivated a-Si photodiode of the matrix of passivated a-Si photodiodes associated with each one of the metal oxide thin film transistors of the matrix of metal oxide thin film transistors and electrically connected to the associated metal oxide thin film transistor, the matrix of passivated a-Si photodiodes including blanket layers of a-Si to form one of P-n or P-i-n photodiodes, performing an isolation etch to separate the blanket layers into the photodiode matrix and passivating the photodiode matrix with a blanket layer of SiN;
   providing a continuous path through the planarizing layer from the exterior of the structure to each metal oxide thin film transistor of the matrix of metal oxide thin film transistors; and
   annealing the structure at a temperature below approximately 200° C. in an oxygen ambient to move oxygen from the oxygen ambient to an active layer of each metal oxide thin film transistor of the matrix of metal oxide thin film transistors and repair loss of oxygen damage to each metal oxide thin film transistor caused by the fabrication of the matrix of passivated a-Si photodiodes.

14. A structure including a high mobility backplane and a-Si photodiode imager comprising:
   a rigid support member with a surface;
   a matrix of metal oxide thin film transistors formed on the surface of the rigid support member, the metal oxide thin film transistors of the matrix of metal oxide thin film transistors including one of an etch-stop type of transistor and a back channel etch type of transistor;

a planarizing layer deposited on the matrix of metal oxide thin film transistors, the planarizing layer being one of porous or permissive/diffusive to oxygen at temperatures below approximately 200° C.;

a matrix of passivated a-Si photodiodes formed over the matrix of metal oxide thin film transistors, one passivated a-Si photodiode of the matrix of passivated a-Si photodiodes associated with each one of the metal oxide thin film transistors of the matrix of metal oxide thin film transistors and electrically connected to the associated metal oxide thin film transistor, the matrix of passivated a-Si photodiodes including blanket layers of a-Si forming one of P-N or P-I-N photodiodes, the photodiode matrix being covered with a blanket layer of SiN, and the a-Si photodiode and SiN blanket layers isolated into separate photodiodes to form the passivated photodiode matrix;

a continuous path through the planarizing layer from the exterior of the structure to each metal oxide thin film transistor of the matrix of metal oxide thin film transistors; and each metal oxide thin film transistor of the matrix of metal oxide thin film transistors being repaired for loss of oxygen damage to each metal oxide thin film transistor caused by fabrication of the matrix of passivated a-Si photodiodes.

* * * * *